(12) United States Patent
Kawamura (10) Patent No.: US 10,379,150 B2
(45) Date of Patent: Aug. 13, 2019

(54) EARTH FAULT DETECTOR

(71) Applicant: Yazaki Corporation, Tokyo (JP)

(72) Inventor: Yoshihiro Kawamura, Makinohara (JP)

(73) Assignee: YAZAKI CORPORATION, Minato-ku, Tokyo (JP)

(*) Notice: Subject to any disclaimer, the term of this patent is extended or adjusted under 35 U.S.C. 154(b) by 136 days.

(21) Appl. No.: 15/820,500

(22) Filed: Nov. 22, 2017

(65) Prior Publication Data

US 2018/0224493 A1    Aug. 9, 2018

(30) Foreign Application Priority Data

Feb. 7, 2017 (JP) .................... 2017-020599

(51) Int. Cl.
*G01R 31/02* (2006.01)
*G01R 31/382* (2019.01)
*B60L 3/00* (2019.01)
*G01R 31/00* (2006.01)

(52) U.S. Cl.
CPC .......... *G01R 31/025* (2013.01); *B60L 3/0046* (2013.01); *B60L 3/0069* (2013.01); *G01R 31/382* (2019.01); *G01R 31/006* (2013.01)

(58) Field of Classification Search
USPC ................. 324/503, 509, 551, 557
See application file for complete search history.

(56) References Cited

U.S. PATENT DOCUMENTS

| 8,106,667 | B2* | 1/2012 | Kawamura | G01R 27/025 |
| | | | | 324/551 |
| 8,248,744 | B2 | 8/2012 | Kawamura et al. | |
| 2008/0079404 | A1* | 4/2008 | Hayakawa | G01R 19/16542 |
| | | | | 323/271 |
| 2009/0289640 | A1 | 11/2009 | Kawamura et al. | |
| 2014/0214262 | A1* | 7/2014 | Iwanabe | G01R 31/025 |
| | | | | 701/31.7 |

FOREIGN PATENT DOCUMENTS

| JP | 10-40770 A | 2/1998 |
| JP | 2008-309751 A | 12/2008 |
| JP | 2009-281986 A | 12/2009 |

OTHER PUBLICATIONS

Communication dated Mar. 19, 2019 from Japanese Patent Office in counterpart JP Application No. 2017-020599.

* cited by examiner

*Primary Examiner* — Vincent Q Nguyen
(74) *Attorney, Agent, or Firm* — Sughrue Mion, PLLC (57) ABSTRACT

A earth fault detector has a controller, a detection capacitor, a positive side first resistance connected to a positive side of a high voltage battery, a negative side first resistance connected to a negative side thereof, a positive side second resistance, a negative side second resistance, a positive side C contact switch, and a negative side C contact switch. The positive side C contact switch switches a connection destination of a first end of the detection capacitor to either a path including the positive side first resistance or a path including the positive side second resistance based on an instruction of the controller. The negative side C contact switch switches a connection destination of a second end thereof to either a path including the negative side first resistance or a path including the negative side second resistance based on an instruction of the controller.

10 Claims, 9 Drawing Sheets

EARTH FAULT DETECTOR

The present invention relates to an earth fault detector using a flying capacitor.

BACKGROUND OF THE INVENTION

A vehicle such as a hybrid vehicle having an engine and an electric motor as a driving source or an electric vehicle charges a battery mounted in a vehicle body, and generates driving force by using an electric energy from the battery. In general, a battery-associated power circuit is configured as a high-voltage circuit for handling high-voltage of 200 V or more. Further, in order to ensure safety, the high-voltage circuit including the battery is ungrounded structure electrically insulated from the vehicle body which is the ground reference potential point.

In the vehicle mounting an ungrounded high-voltage battery, an earth fault detector is provided so as to monitor a system in which the high-voltage battery is arranged, more specifically, an insulated condition (ground fault) between a main power system from the high-voltage battery to a motor and the vehicle body. In the earth fault detector, a system using a capacitor called as a flying capacitor is widely used.

Figure 6:
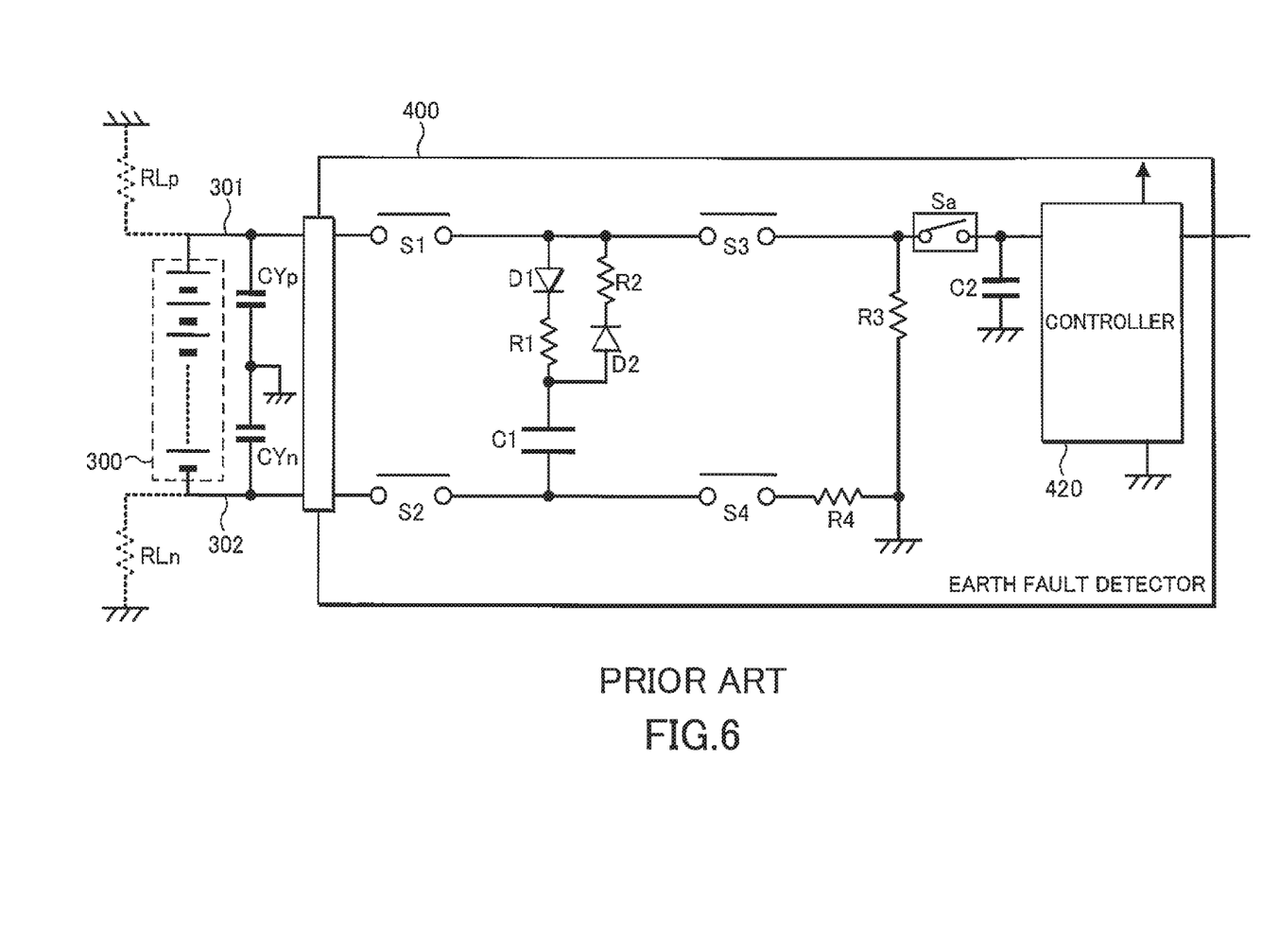
FIG. 6 is a diagram showing a circuit example of a conventional earth fault detector of a flying capacitor type.

FIG. 6 is a drawing showing an example of a circuit of the conventional earth fault detector of a flying capacitor system. As shown in FIG. 6, the earth fault detector 400 is connected to an ungrounded high voltage battery 300, and is a device for detecting an earth fault of a system having the high voltage battery 300. Herein, an insulation resistance between a positive side of the high voltage battery 300 and a ground is indicated as RLp, an insulation resistance between a negative side thereof and the ground is indicated as RLn.

As shown in FIG. 6, the earth fault detector 400 includes a detection capacitor C1 operating as a flying capacitor. Further, the earth fault detector 400 includes four switching elements S1 to S4 around the detection capacitor C1 so as to switch measurement paths and to control charge and discharge of the detection capacitor C1. Furthermore, it includes a switching element Sa so as to sampling a measurement voltage corresponding to a charge voltage of the detection capacitor C1.

In the earth fault detector 400, a measurement operation of V0 measurement period→Vcln measurement period→V0 measurement period→Vc1p measurement period as one cycle is repeated. In those periods, the detection capacitor C1 is charged with a voltage of a measurement target, and then a charge voltage of the detection capacitor C1 is measured. Also, in order to perform a next measurement, the detection capacitor C1 is discharged.

Figure 7A:
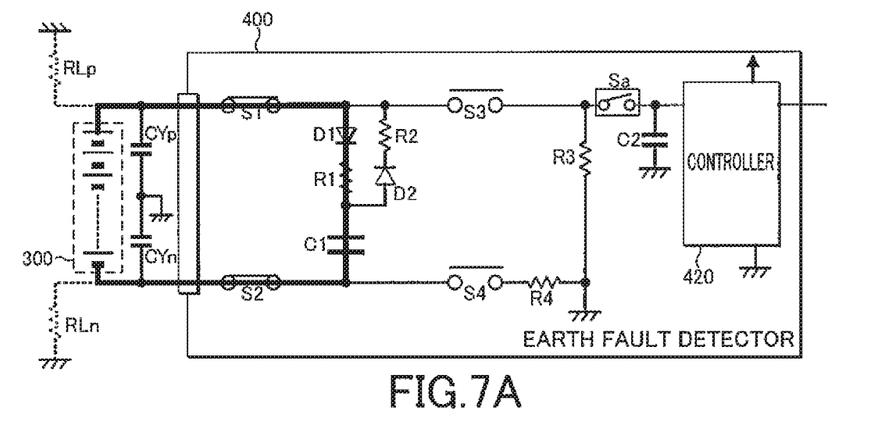
FIG. 7A to 7C are diagrams showing a measurement path of a V0 measure period.

In the V0 measurement period, a voltage corresponding to a voltage of the high voltage battery is measured. For this reason, the switching elements S1 and S2 are turned ON, the switching elements S3 and S4 are turned OFF, and then the detection capacitor X1 is charged. That is, as shown in FIG. 7A, the high voltage battery 300, a resistance R1, and the detection capacitor C1 become a measurement path.

Figure 7B:
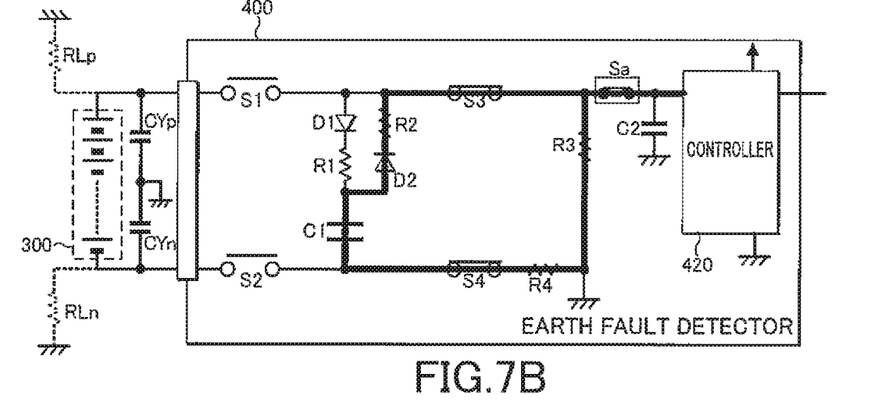
Figure 7C:
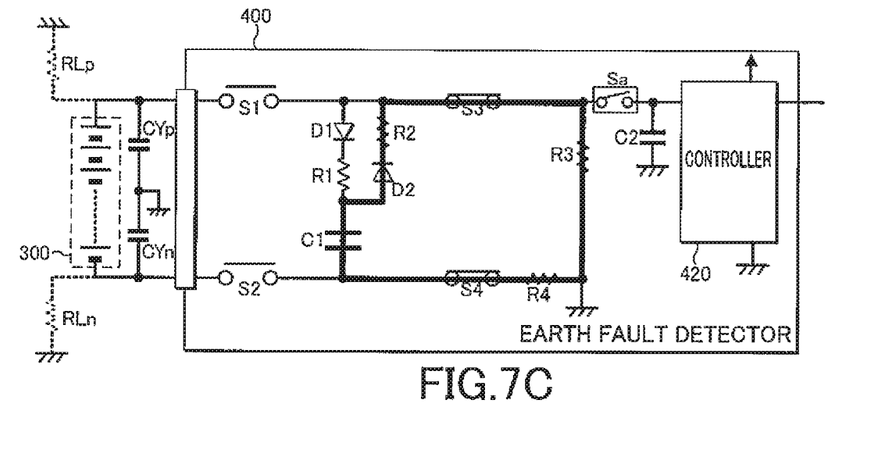

When measuring the charge voltage of the detection capacitor C1, as shown in FIG. 7B, the switching elements S1 and S2 are turned OFF, the switching elements S3 and S4 are turned ON, and the sampling is performed in the controller 420 while the switching element Sa is turned ON. Thereafter, as shown in FIG. 7C, the switching element Sa is turned OFF, and then the detection capacitor C1 is discharged so as to perform next measurement. When measuring the charge voltage of the detection capacitor C1, an operation when discharging the detection capacitor C1 is the same that in the other measurement period.

Figure 8A:
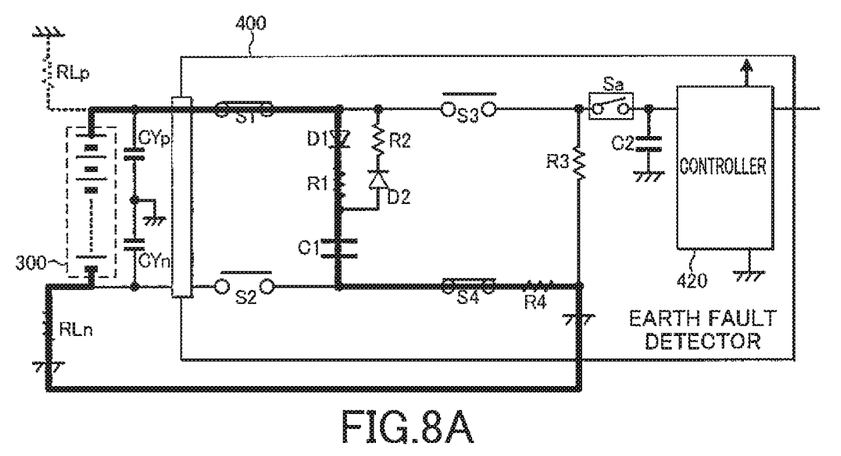
FIGS. 8A and 8B are diagrams showing measurement paths of a Vcln measure period and a Vc1$p$ measure period.

In the Vcln measurement period, a voltage reflecting the effect of the insulation resistance RLn is measured. Therefore, the switching elements S1 and S4 are turned ON, the switching elements S2 and S3 are turned OFF, and the detection capacitor C1 is charged. That is, as shown in FIG. 8A, the high voltage battery 300, the resistance R1, the detection capacitor C1, the resistance R4, the ground, and the insulation resistance RLn become a measurement path.

Figure 8B:
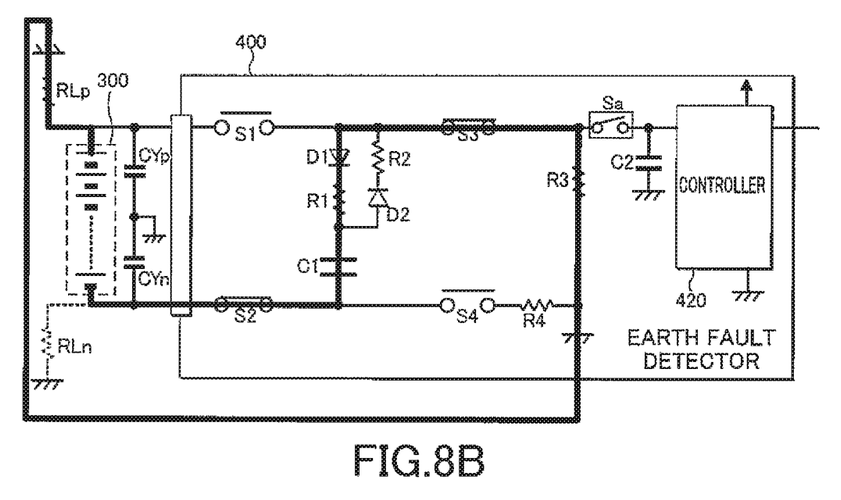

In the Vc1p measurement period, a voltage reflecting the effect of the insulation resistance RLp is measured. Therefore, the switching elements S2 and S3 are turned ON, the switching elements S1 and S4 are turned OFF, and the detection capacitor C1 is charged. That is, as shown in FIG. 8B, the high voltage battery 300, the insulation resistance RLp, the ground, the resistance R3, the resistance R1, and the detection capacitor C1 become a measurement path.

It is known that $(PLp \times RLn)/(RLp+RLn)$ can be obtained based on $(Vc1p+Vcln)/V0$ calculated from V0, Vc, Vcln, and Vc1p obtained in those measurement periods. For this reason, the controller 420 in the earth fault detector 400 can get the insulation resistances RLp and RLn by measuring V0, Vcln, and Vc1p. Further, when the insulation resistances RLp and RLn becomes equal to or lower than a predetermined judgment reference level, it is judged that the earth fault is generated, and then an alarm is outputted.

Figure 9:
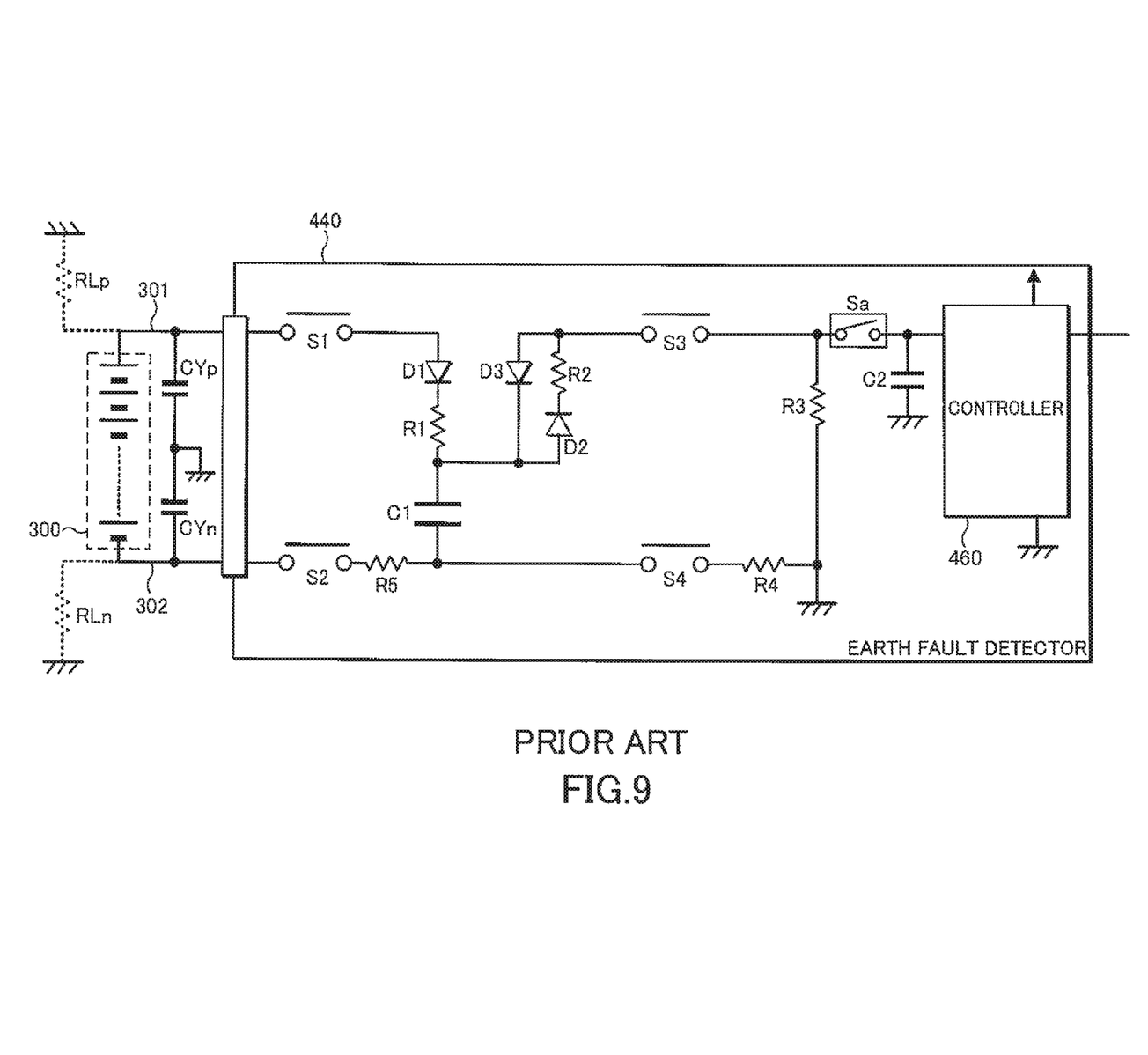
FIG. 9 is a diagram showing another example of the conventional earth fault detector of the flying capacitor tape.

Further, in a Patent Literature 1, the earth fault detector 440 having a circuit configuration as shown in FIG. 9 is suggested. In the earth fault detector 440, a switching state of each of the measurement periods is the same as the earth fault detector 400.

Patent Literature 1: JP 2009-281986 A

SUMMARY OF THE INVENTION

Objects to be Solved

In the conventional earth fault detector, the switching elements S1 to S4 are configured to have four optical MOS-FETs which are an insulating type switching elements. However, the optical MOS-FET is expansive, and thereby the cost of the earth fault detector is increased.

Therefore, an object of the present invention is to suppress an increase in cost caused by a switching element in an earth fault detector using a flying capacitor.

In order to solve the above problem, an earth fault detector of the present invention is connected to a non-ground high voltage battery, and detects an earth fault of a system in which the high voltage battery is provided. The earth fault detector includes a controller; a detection capacitor operating as a flying capacitor; a positive side first resistance connected to a positive side of the high voltage battery; a negative side first resistance connected to a negative side of the high voltage battery; a positive side second resistance of which one end is grounded and a voltage of another end is measured by the controller; a negative side second resistance of which one end is grounded; a positive side C contact switch alternatively switching a connection destination of a first end of the detection capacitor to either a path including the positive side first resistance or a path including the positive side second resistance based on an instruction of the controller; and a negative side C contact switch alternatively switching a connection destination of a second end of the detection capacitor to either a path including the negative side first resistance or a path including the negative side second resistance based on the instruction of the controller.

Herein, the controller, when simultaneously operating and switching the positive side C contact switch and the negative side C contact switch, can control, so that either the positive side C contact switch or the negative side C contact switch is switched in advance and that opportunities for switching first are equalized.

Further, the positive side C contact switch and the negative side C contact switch may be formed as twin relays in which interlocking relays are connected in parallel.

In this time, equal value shunt resistances may be connected in series to a detection capacitor connecting side in each of the twin relays.

Alternatively, the positive side first resistance may be formed by connecting in series an equal value resistance at a high voltage battery connecting side of each of the twin relays forming the positive side C contact switch, the negative side first resistance may be formed by connecting in series an equal value resistance at the high voltage battery connecting side of each of the twin relays forming the negative side C contact switch, and equal value shunt resistances may be connected in series to a positive side second resistance connecting side of each of the twin relays forming the positive side C contact switch and a negative side second resistance connecting side of each of the twin relays forming the negative side C contact switch.

In any cases, for example, the positive side C contact switch and the negative side C contact switch may be constructed by a mechanical relay or a reed relay.

Effect of the Invention

According to the present invention, in the earth fault detector using the flying capacitor, the optical MOS-FET due to cost increase is not used. Therefore, the cost increase due to the switching element can be suppressed.

DESCRIPTION OF THE PREFERRED EMBODIMENT

Figure 1:
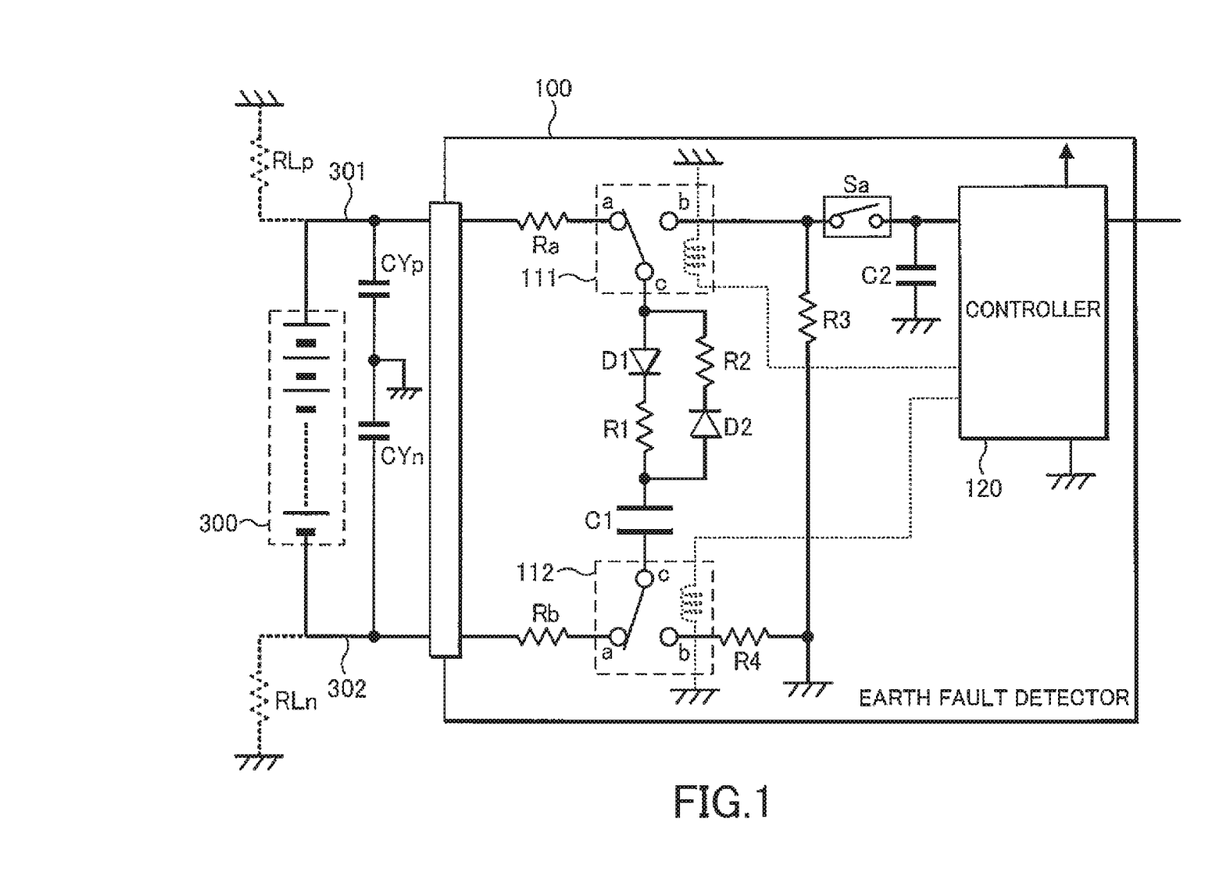
FIG. 1 is a block diagram showing a configuration of an earth fault detector according to an embodiment of the present invention.

An embodiment of the present invention will be explained with reference to drawings. FIG. 1 is a block diagram showing a configuration of an earth fault detector 100 according to the embodiment of the present invention. As shown in FIG. 1, the earth fault detector 100 is connected to an ungrounded high-voltage battery 300, and is a device of a flying capacitor type for detecting an earth fault of a system in which the high voltage battery 300 is provided. Herein, an insulation resistance arranged between a positive side of the high-voltage battery 300 and a ground is represented as RLp, and an insulation resistance arranged between a negative side thereof and the ground is represented as RLn. Also, the high voltage means a high voltage larger than a low voltage battery (In general, 12V) so as to drive various instruments (such as a lamp, wiper and so on) in a vehicle, and the high voltage battery 300 is a battery used for driving the vehicle so as to run it.

The high voltage battery 300 is constructed by a rechargeable battery such as a lithium ion battery, is discharged via a high voltage bus bar not shown, and drives an electric motor connected via an inverter or the like. Further, during regeneration or when charging equipment is connected, charging is performed via the high voltage bus bar.

Capacitors CYp and CYn referred as Y capacitor (line-bypass-capacitor) are connected between a positive side power line 301 of the high voltage battery 300 and a ground electrode, and between a negative side power line 302 and the ground electrode so as to remove high-frequency noise of power source or too stabilize the operation. Meanwhile, the Y capacitor may be omitted.

As shown in drawings, the earth fault detector 100 has a detection capacitor C1 operating as a flying capacitor, and a switching element Sa for sampling a measurement voltage corresponding to a charge voltage of the detection capacitor C1. Herein, the switching element Sa may be omitted. Further, the earth fault detector 100 has a controller 120 configured by a microcomputer. The controller 120 performs various controls required for the earth fault detector 100 such as a switch switching processing described later by implementing a pre-embedded program.

As described with reference to FIGS. 7 and 8, in a measurement path of each of measurement periods, a switching element S1 and a switching element S3 in a positive side power line 301 system are not turned ON at the same time, and a switching element S2 and a switching element S4 in a negative side power line 302 system are not turned ON at the same time. In other words, the switching element S1 and the switching element S3 are exclusively switched, and the switching element S2 and the switching element S4 are exclusively switched.

For this reason, in the earth fault detector 100, a positive side C contact switch 111 is used as a switching element of the positive side power line 301 system, and a negative side C contact switch 112 is used as a switching element of the negative side power line 302 system. The positive side C contact switch 111 and the negative side C contact switch 112 may be constructed for example by mechanical relays having a high-withstanding pressure—small signal or reed relays.

Common contact points c in both the positive side C contact switch 111 and the negative side C contact switch 112 are arranged in a detection capacitor C1 side. More specifically, the common contact point c of the positive side C contact switch 111 is connected to one end of the detection capacitor C1 via a parallel circuit having a path of a diode D1 and a resistance R1 and a path of a resistance R2 and a diode D2. Further, the common contact point c of the negative side C contact switch 112 is connected to the other end of the detection capacitor C1. The diode D1 which becomes a path during charging is connected in a direction in which a path from the positive side C contact switch 111 to the detection capacitor C1 becomes a forward direction, and the diode D2 which becomes a path during discharging is connected in the opposite direction. The resistance R2 functions as a discharge resistor.

A contact a contact point a of the positive side C contact switch 111 is connected to the positive side power line 301 through the resistance Ra, and a contact portion a of the negative side C contact switch 112 is connected to the positive side power line 301 through the resistance Rb. In other words, in both the positive side C contact switch 111 and the negative side C contact switch 112, the contact points a are positioned at a high voltage battery 300 side.

A contact point b of the positive side C contact switch 111 is connected to the switching element Sa, and is connected to a resistance R3 in which another end is grounded. A contact point b of the negative side C contact switch 112 is connected to a resistance R4 in which another end is grounded. That is, in both the positive side C contact switch 111 and the negative side C contact switch 112, the contact portions b are positioned at a controller 120 side (ground side).

As shown in FIG. 1, the positive side C contact switch 111 and the negative side C contact switch 112 are independently switched and controlled by the controller 120. The controller 120 switches measurement paths by independently switching and controlling the positive side C contact switch 111, the negative side C contact switch 112, and the switching element Sa, and performs charging and discharging of the detection capacitor C1 and measure of charge voltage.

In particular, in the V0 measurement period, both the positive side C contact switch 111 and the negative side C contact switch 112 are switched to a contact point a side, and a measurement path of the high voltage battery 300 the resistance Ra, the resistance R1, the detection capacitor C1 and the resistance Rb is formed.

When measuring the charge voltage of the detection capacitor C1, both the positive side C contact switch 111 and the negative side C contact switch 112 are switched to a contact potion b side, and the switching element Sa is turned ON. Thereafter, the switching element Sa is turned OFF, and for the next measurement, the detection capacitor C1 is mainly discharged by using the resistance R2. When measuring the charge voltage of the detection capacitor C1, the operation during discharging is the same in other measurement periods.

In the Vc1n measurement period, the positive side C contact switch 111 is switched to the contact point a side, and the negative side C contact switch 112 is switched to the contact point b side. Further, a measurement path of the high voltage battery 300, the resistance Ra, the resistance R1, the detection capacitor C1, the resistance R4, the ground, and the insulation resistance RLn is formed.

In the Vc1p measurement period, the positive side C contact switch 111 is switched to the contact point b side, and the negative side C contact switch 112 is switched to the contact point a side. Further, a measurement path of the high voltage battery 300, the insulation resistance RLp, the ground, the resistance R3, the resistance R1m the detection capacitor C1 and the resistance Rb is formed.

In the earth fault detector 100, the resistance Ra, the resistance Rb, and the resistance R1 are high resistances having for example several hundred kΩ, and the resistance R2, the resistance R3, and the resistance R4 are low resistances having for example several kΩ.

Separately from the resistance R1, the resistance Ra is arranged on the positive side, and the resistance Rb is arranged on the negative side. The positive side C contact switch 111 and the negative side C contact switch 112 are constructed by a C contact point relay. Therefore, even if fixing occurs with any of the C contact switches, either the resistance Ra of high resistance or the resistance Rb of high resistance is arranged between the high voltage battery 300 and the controller 120, and thereby current is restricted. For this reason, the controller 120 and an energizing circuit can be protected.

Furthermore, even if the contact point a and the contact point b are shorted out at either the positive side C point switch or the negative side C point switch, either the resistance Ra of high resistance or the resistance Rb of high resistance is arranged between the high voltage battery 300 and the controller 120, and thereby current is restricted. Therefore, the controller 120 can be protected.

Moreover, in a case that a reference value for determining earth fault in the insulation resistance RLp and the insulation resistance RLn is RLs, when the insulation resistance RLp and the insulation resistance RLn are the reference value PLs, each of the resistance value is defined with a relationship of R1+Ra+Rb=R1+R4+Ra+RLn=R1+R3+Rb+RLp so that the resistance values on the path become equal in the V0 measurement period, Vc1n measurement period, and Vc1p measurement period. Therefore, although a ceramic capacitor is used as the detection capacitor C1, it is possible to prevent the earth fault detection accuracy from decreasing due to the influence of DC bias characteristic.

In the positive side C contact switch 111 and the negative side C contact switch 112, one of the contact points a at the high voltage battery 300 side and the contact point b at the controller 120 side (ground side) can be appropriately set to a normal close side in consideration of the following characteristics.

1) When the contact points a at the high voltage battery 300 side in both the positive side C contact switch 111 and the negative side C contact switch 112 are set to the normally closed sides, the high voltage has already been charged to the detection capacitor C1 at the start of starting of the earth fault detector 100. Therefore, the charging process for the first V0 measurement period can be omitted. Thus, it is possible to respond to a functional need of quickening the earth fault judgment from the normal time in order to ensure safety at startup.

2) When the contact points b at the controller 120 side in both the positive side C contact switch 111 and the negative side C contact switch 112 are set to the normally closed sides, the detection capacitor C1 becomes a discharged state at the time of operation stop. Therefore, the risk of electric shock such as a removal of the earth fault detector 100 is reduced.

3) When either the positive side C contact switch 111 or the negative side C contact switch 112 is set to the normally closed side, voltage between one of the positive side C contact switch 111 and the negative side C contact switch 112 and the ground is charged to the detection capacitor C1 at the time of start. By measuring this voltage and comparing it with the normal state, a state that the insulation resistance of one of them is decreased can be simply and instantaneously understood.

As explained above, in the earth fault detector 100 of the embodiment in the present invention, an optical MOS-FET which causes cost increase is not used as a switch for switching the measurement path for detecting earth fault. Therefore, cost increase due to the switching element can be suppressed.

Further, the switching element used in the past with four switches is structured by two C contact point switches. Therefore, it is possible to reduce the number of components as well as to reduce the number of control lines as compared with the prior art.

Figure 2:
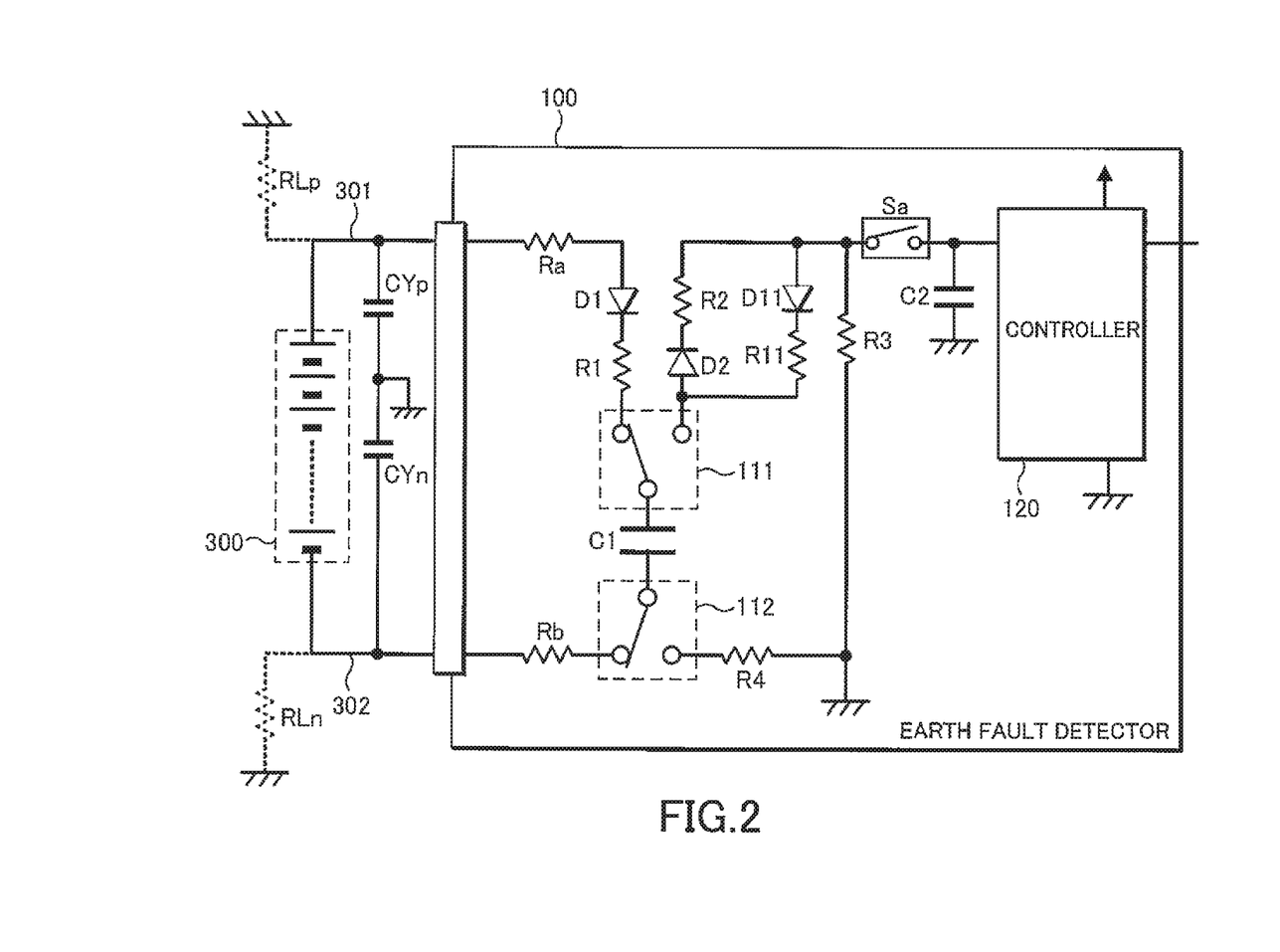
FIG. 2 is a diagram showing another example of an arrangement place of a positive side C contact point switch.

Also, in the above example, the positive side C contact switch 111 is connected to the detection capacitor C1 via the parallel circuit including the path of the diode D1 and the resistance R1 and the path of the resistance R2 and the diode D2. However, as shown in FIG. 2, the common contact point c of the positive side C contact switch 111 may be directly connected to the detection capacitor C1. In this case, the contact point a is connected to the resistance Ra via the diode D1 and the resistance R1, and the contact point b is connected to the switching element Sa via the diode D2 and the resistance R2. A path of the diode D2 may be connected in parallel to a path of the diode D11 in a direction opposite to the diode D2 and the resistance R11.

Moreover, the C contact switches are structured by mechanical contact arrangement. For this reason, the number of open-close endurance is limited. Specially, as energizing current and applied voltage become large, influences on the number of open-close endurance becomes great. Thus, in order to increase the number of open-close endurance, control described below may be performed, and structure as shown in below may be adopted.

First Example

In a case that the C contact switch is switched, when the positive side C contact switch 111 and the negative side C contact switch 112 are switched at the same time, variation occurs before and after an actual switching order due to variations in contact operation speed.

In this case, load of current and voltage is concentrated on the C contact switch switched later, and have impact on the number of open-close endurance. In particular, it is prominently visible in a timing of switching to the V0 measurement period measuring voltage of the high voltage battery 300.

Therefore, the controller 120 moves a timing of switching of the C contact switches back and forth so that the number of back and forth in both the positive side C contact switch 111 and the negative side C contact switch 112 is equalized, and thereby avoiding concentration of loads on one of the C contact switches.

For example, in a cycle of V0 measurement period→Vcln measurement period V0 measurement period Vc1p measurement period, the positive side C contact switch 111 is switched to 1 ms beforehand in first V0 measurement period, and the negative side C contact switch 112 is switched to 1 ms beforehand in second V0 measurement period. Therefore, loads of the C contact switches are equalized, and thereby a negative impact of the number of the open-close endurance due to the concentration of loads on one of the C contact switches can be prevented. Of course, an approach for equalizing the number of back and forth in the timing of switching is limited to the embodiment of present invention. For example, various approaches such as replacing the C contact switch for switching previously for every predefined numbers or time periods can be used.

Second Example

Figure 3:
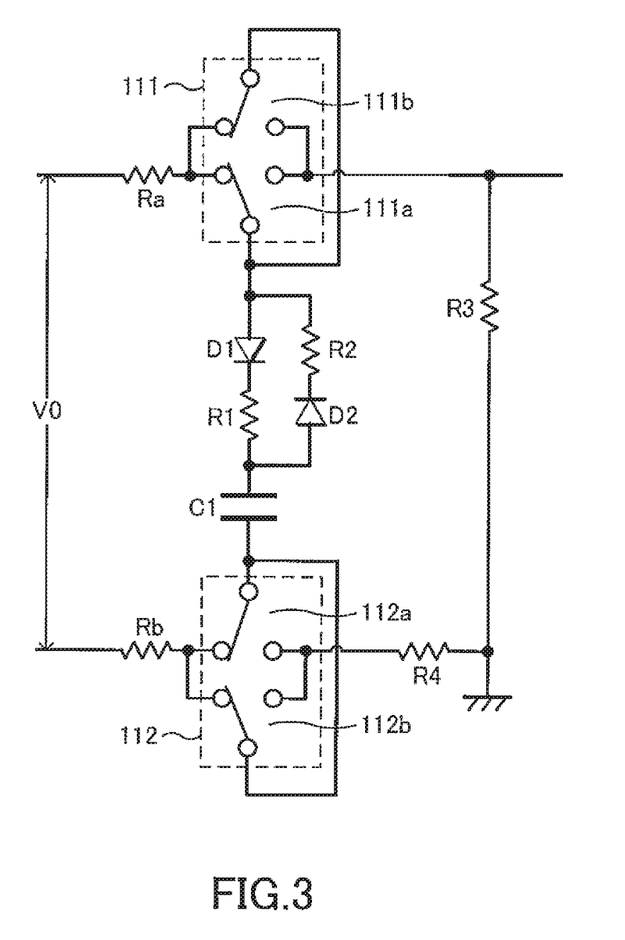
FIG. 3 is a diagram showing a first circuit example applying a twin relay to a C contact point switch.

As shown in FIG. 3, the positive side C contact switch 111 is constructed by twin relay (111a, 111b) switching at the same time with one control, and the negative side C contact switch 112 is constructed by twin relay (112a, 112b) switching at the same time with one control. Further, a path that current is divided in parallel for each relay of the twin relays is provided. Therefore, energizing current of each of the C contact switches is distributed, and thereby current load of the C contact switches can be reduced. For example, the twin relay can use a relay of two C contacts in one coil.

Third Example

In the above second example, a shunt ratio in the twin relay connected in parallel is based on a minimal contact resistance of the relay constructing the twin relay. For this reason, load is applied to one of the relays due to variations among individuals.

Figure 4:
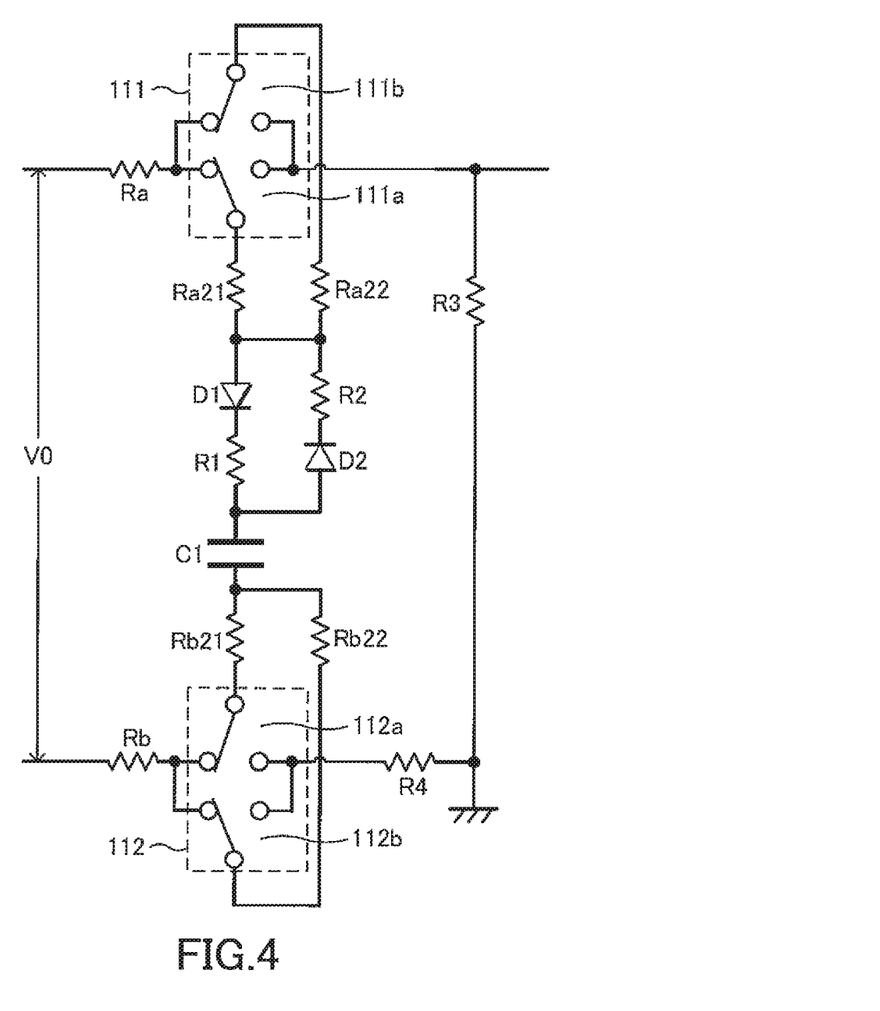
FIG. 4 is a diagram showing a second circuit example applying a twin relay to a C contact point switch.

Therefore, as shown in FIG. 4, a small shunt resistance may be connected to a path at a contact point c side of each of the relays. In this case, the shunt ratio is approximately based on the shunt resistance. Thus, by equalizing the shunt resistance value, a bias of loads on one of the relays constructing the twin relay can be prevented.

In the examples of FIG. 4, a shunt resistance Ra21 (<<R1) is connected to a path of a relay 111a constructing the positive side C contact switch 111, and a shunt resistance Ra22 (=Ra21) is connected to a path of a relay 111b. Further, a shunt resistance Rb21 (<<R1) is connected to a path of a relay 112a constructing the negative side C contact switch 112, and a shunt resistance Rb22 (=Rb21) is connected to a path of a relay 112b.

Fourth Example

Figure 5:
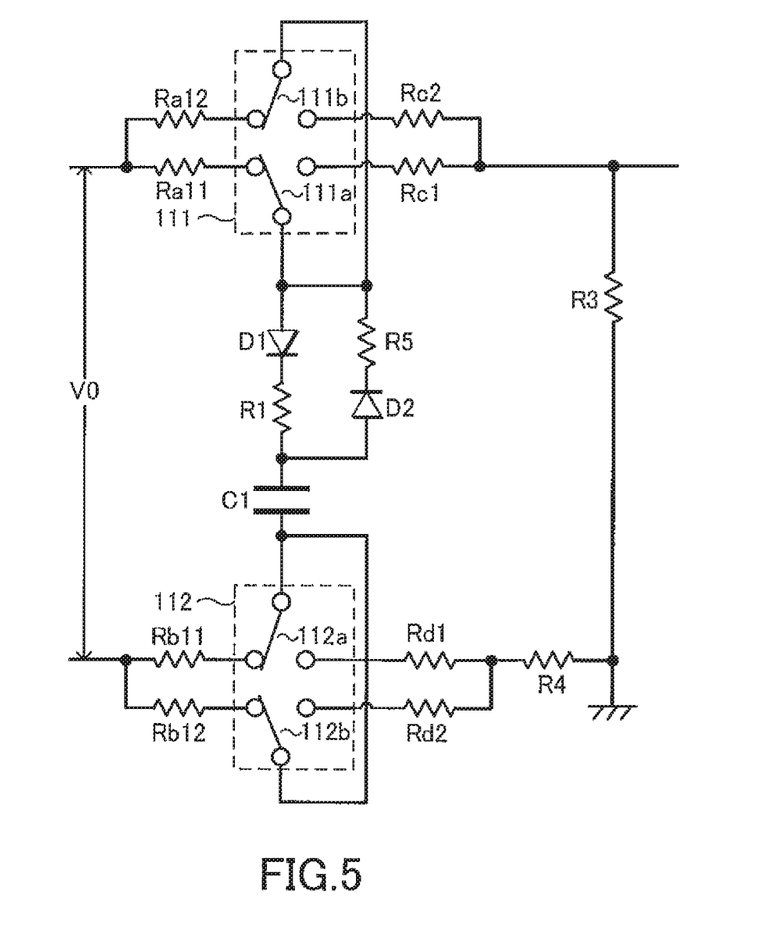
FIG. 5 is a diagram showing a third circuit example applying a twin relay to a C contact point switch.

As shown in FIG. 5, the shunt resistance may be arranged in a contact point a side path of each of the relays and a contact point b side path thereof. In the example of FIG. 5, a resistance Ra11 is connected to a contact point a side of a relay 111a, a resistance Ra12 is connected to a contact point a side of a relay 111b, a resistance Rc1 is connected to a contact point b side of the relay 111a, and a resistance Rc2 is connected to a contact point b side of the relay 111b. Further, a resistance Rb11 is connected to a contact point a side of a relay 112a, a resistance Rb12 is connected to a contact point a side of the relay 112b, a resistance Rd1 is connected to a contact point b side of the relay 112a, and a resistance Rd2 is connected to a contact point b side of the relay 112b.

Herein, the example is set to the resistance Ra11=resistance Ra12=resistance Rb11=resistance Rb12>>resistance Rc1=resistance Rc2=resistance Rd1=resistance Rd2>>the contact resistance of the relay.

Moreover, in the above example of FIG. 5, parallel resistance of the resistance Ra11 and the resistance Ra12 assumes a role as the resistance Ra, and parallel resistance of the resistance Rb11 and the resistance Rb12 assumes a role as the resistance Rb. Therefore, if they are made to have the same resistance as FIG. 1, they are set to the resistance Ra11=the resistance Ra12=the resistance Rb11=the resistance Rb12=2×the resistance Ra=2×the resistance Rb.

Thereby, even if any of relays is fixed or shorted, energizing current is limited by any of the resistances Ra11, the resistance Ra12, the resistance Rb11, and the resistance Rb12. For this reason, in addition to be able to protect the controller 120, earth fault error detection caused by detecting small insulation resistance due to current increases flowing in the measurement path can be prevented.

Also, the resistance Rc1, the resistance Rc2, the resistance Rd1, and the resistance Rd2 may be replaced with the resistances Ra21, Ra22, Rb21, and Rb22 in the third example.

100 earth fault detector
111 positive side C contact switch
112 negative side C contact switch
120 controller
300 high voltage battery
301 positive side power line
302 negative side power line

The invention claimed is:

1. A earth fault detector connected to a non-ground high voltage battery and detecting an earth fault of a system in which the high voltage battery is provided, the earth fault detector comprising:
   a controller;
   a detection capacitor operating as a flying capacitor;
   a positive side first resistance connected to a positive side of the high voltage battery;
   a negative side first resistance connected to a negative side of the high voltage battery;
   a positive side second resistance of which one end is grounded and a voltage of another end is measured by the controller;
   a negative side second resistance of which one end is grounded;
   a positive side C contact switch alternatively switching a connection destination of a first end of the detection capacitor to either a path including the positive side first resistance or a path including the positive side second resistance based on an instruction of the controller; and
   a negative side C contact switch alternatively switching a connection destination of a second end of the detection capacitor to either a path including the negative side first resistance or a path including the negative side second resistance based on the instruction of the controller.

2. The earth fault detector according to claim 1, wherein the controller, when simultaneously operating and switching the positive side C contact switch and the negative side C contact switch, controls, so that either the positive side C contact switch or the negative side C contact switch is switched in advance and that opportunities for switching first are equalized.

3. The earth fault detector according to claim 2, wherein the positive side C contact switch and the negative side C contact switch are constructed by a mechanical relay or a reed relay.

4. The earth fault detector according to claim 1, wherein the positive side C contact switch and the negative side C contact switch are formed as twin relays in which interlocking relays are connected in parallel.

5. The earth fault detector according to claim 4, wherein equal value shunt resistances are connected in series to a detection capacitor connecting side in each of the twin relays.

6. The earth fault detector according to claim 5, wherein the positive side C contact switch and the negative side C contact switch are constructed by a mechanical relay or a reed relay.

7. The earth fault detector according to claim 4, wherein
   the positive side first resistance is formed by connecting in series an equal value resistance at a high voltage battery connecting side of each of the twin relays forming the positive side C contact switch,
   the negative side first resistance is formed by connecting in series an equal value resistance at the high voltage battery connecting side of each of the twin relays forming the negative side C contact switch, and
   equal value shunt resistances are connected in series to a positive side second resistance connecting side of each of the twin relays forming the positive side C contact switch and a negative side second resistance connecting side of each of the twin relays forming the negative side C contact switch.

8. The earth fault detector according to claim 7, wherein the positive side C contact switch and the negative side C contact switch are constructed by a mechanical relay or a reed relay.

9. The earth fault detector according to claim 4, wherein the positive side C contact switch and the negative side C contact switch are constructed by a mechanical relay or a reed relay.

10. The earth fault detector according to claim 1, wherein the positive side C contact switch and the negative side C contact switch are constructed by a mechanical relay or a reed relay.

* * * * *